United States Patent [19]

Holden et al.

[11] Patent Number: 4,904,192
[45] Date of Patent: Feb. 27, 1990

[54] BATTERY CONTACTS

[75] Inventors: Harold Holden; John R. Benyo, both of Boca Raton, Fla.

[73] Assignee: Motorola, Inc., Schaumburg, Ill.

[21] Appl. No.: 293,849

[22] Filed: Jan. 5, 1989

[51] Int. Cl.$^4$ .............................................. H01R 9/09
[52] U.S. Cl. ........................................ 439/78; 439/80; 439/841
[58] Field of Search ............................ 439/78, 80–83, 439/840, 841, 876

[56] References Cited

U.S. PATENT DOCUMENTS

| | | | |
|---|---|---|---|
| 3,885,848 | 5/1975 | Brouneus | 439/841 |
| 4,408,817 | 10/1983 | Mattis | 439/78 |
| 4,702,707 | 10/1987 | Hillbish | 439/80 |
| 4,749,357 | 6/1988 | Foley | 439/80 |
| 4,824,380 | 4/1989 | Matthews | 439/80 |

Primary Examiner—P. Austin Bradley
Attorney, Agent, or Firm—Vincent B. Ingrassia; Anthony J. Sarli, Jr.

[57] ABSTRACT

A battery contact (1) for connecting a battery (9) to an electric circuit (4) is comprised a first portion (2) for coupling to the electric circuit and a second portion (3) for coupling to the battery. The contact is made in one piece of electrically conductive sheet metal and is cut and bent so as to form the second portion into a tapered helical spring. The first portion (2) is formed with two retaining prongs (6,7) which facilitate locating and fixing the contact to the electric circuit (4) and a tab 8 which is used for soldering the contact to the electric circuit. In order to allow the contact to be easily picked-up in an automatic manufacturing line, a flat handling portion (11) is provided between the first and second portions.

7 Claims, 2 Drawing Sheets

BATTERY CONTACTS

BACKGROUND OF THE INVENTION

This invention relates to battery contacts which are used to provide an electrical connection between an electric circuit and a battery. Such contacts generally comprise one portion for coupling to the circuit and a second portion for contact with the battery. In order to maintain adequate electrical connection with the battery, the second portion is often made in the form of a spring which exerts sufficient force against the battery to maintain electrical connection even under stress conditions.

Such springs have normally been made as either leaf springs or helical springs. The leaf-spring version generally consists of a flat, battery connecting portion attached via a bent portion to the circuit-connecting portion, the bend providing the spring effect. The helical spring version generally consists of a round-wire helical spring portion, usually with the helix being in a conical configuration, attached to the circuit-connecting portion. This circuit-connecting portion has also generally been made of round-wire so as to be integral with the spring portion.

A problem with the leaf spring type battery contacts is that they do not readily facilitate the use of different size batteries as they do not exert sufficient force to maintain good electrical contact with a variety of battery sizes. The helical spring type battery contacts are better at facilitating the use of different size batteries but, having round-wire circuit connecting portions renders them difficult to use on automatic assembly lines since it requires very accurate sensing to enable round wire ends to be picked up and positioned by automatic apparatus. Furthermore, such round wire battery contacts cannot be picked up by vacuum operated pickup arms as there is insufficient surface area for the vacuum to work against.

It is, therefore, an object of the present invention to provide a battery contact which can be used with a wide variety of battery sizes and which can easily be found and handled by automatic assembly lines.

SUMMARY OF THE INVENTION

Accordingly, the invention provides a battery contact manufactured in one piece from electrically conductive sheet metal comprising a first portion for coupling to an electric circuit and a second portion in the form of a helical spring for coupling to a battery. The second portion is preferably in the form of a tapered helical spring. Also, there is preferably provided a handling portion between the first portion and the spring portion, the handling portion conveniently being substantially flat in order to facilitate pick-up using vacuum operation. In a preferred embodiment, the first portion includes at least one tab for connection to an electric circuit, such as a printed circuit board and preferably also includes at least one retaining prong for locating and fixing the battery contact to the electric circuit before soldering takes place.

DESCRIPTION OF THE PREFERRED EMBODIMENT

Figure 1:
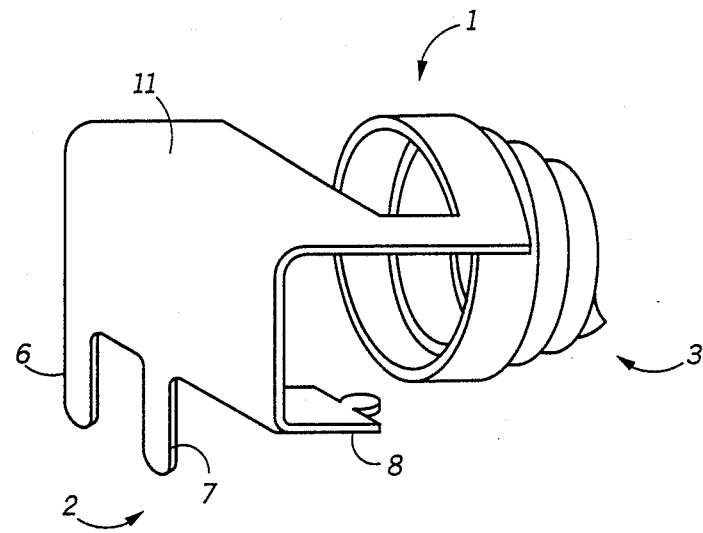
FIG. 1 is a perspective view of a battery contact according to the invention.
Figure 2:
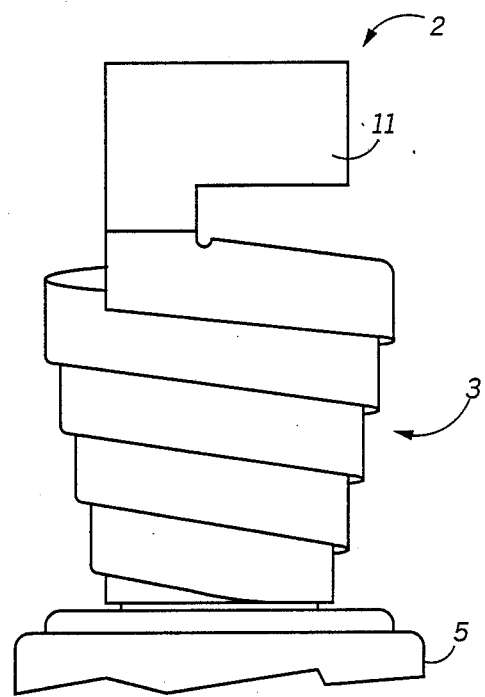
FIG. 2 is a plan view of the battery contact of FIG. 1.

Thus, the drawings show several views of a battery contact 1 having a first portion 2 for coupling to an electric circuit and a second portion 3 for contacting a battery. The electric circuit is represented by part of a printed circuit board (PCB) 4 and the battery is designated 5. However, neither the PCB nor the battery are shown in all of the views.

The contact 1 is manufactured from sheet metal by a process of punching a blank from the sheet and then simply bending the blank into the correct shape as shown in the drawings. The metal should, of course, be electrically conductive and also springy. Examples of suitable materials are stainless steel and beryllium copper although any similar material may alternately be used.

Figure 3:
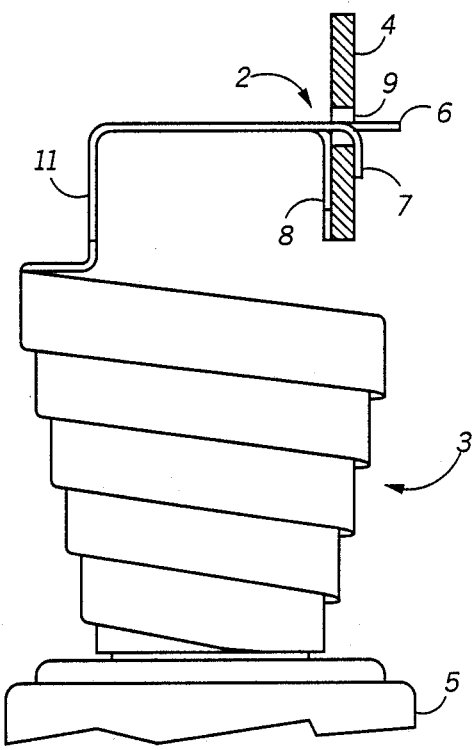
FIG. 3 is a side view of the battery contact of FIG. 1.
Figure 4:
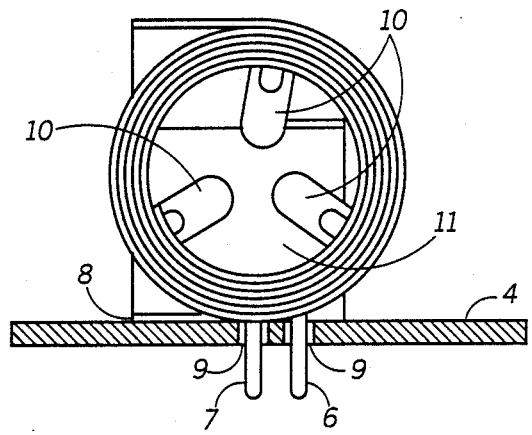
FIG. 4 is an end view of the battery contact of FIG. 1.

The first portion 2 of the contact is designed for connection to a printed circuit board for use in instruments such as pagers, radios, etc. It comprises two parallel prongs 6, 7 and a tab 8 arranged perpendicularly to the prongs. The two prongs enter through respective holes 9 in the PCB 4 and are then bent over to retain the battery contact on the PCB. The two prongs 6,7 are shown in FIG. 4 passing through holes in the PCB 4 and in FIG. 3, one of the prongs, 7, is shown bent over. The tab 8 sits flat against the PCB 4 providing self-location, self-fixturing and stability of the contact prior to soldering of the tab 8 to the PCB 4.

The second portion 3 of the contact is shaped in the form of tapered helical spring. Of course, since the contact is made of sheet metal, the helices of the spring are not round in cross-section, but are in the form of a strip of metal coiled in a helical manner with gradually reducing radius toward the end of the spring remote from the first portion 2. This end of the spring is used to contact the battery and includes three radial prongs 10 which are directed towards the axis of the spring at its outer end for contact with the battery.

In order to facilitate the use of the battery contact in an automatic manufacturing line where the contacts are required to be picked up and placed by automatic robot-like arms the battery contact 1 is formed with a substantially flat handling portion 11 between the first, electric circuit coupling portion 2 and the second, battery contacting portion 3. This handling portion 11 allows the contact to be easily picked up using vacuum pick-up arms and placed in the correct position on the PCB 4. It will be apparent that although the electric circuit coupling portion 2 and the handling portion 11 have been described with particular features and shapes, any desired shape that may be cut out of sheet metal may be used within the scope of this invention according to the type of electric circuit the contact is to be coupled to and the type of pick-up means employed in the automatic manufacturing line.

We claim:

1. A battery contact manufactured in one piece from electrically conductive sheet metal and comprising a first portion for coupling to an electric circuit and a second portion in the form of a helical spring for coupling to a battery, said first portion including at least one tab for soldering to an electric circuit and at least one retainer prong for locating and fixing the battery contact to the electric circuit prior to soldering.

2. A battery contact according to claim 1 wherein said second portion is in the form of a tapered helical spring.

3. A battery contact according to claim 1 wherein said second portion is in the form of a strip of metal coiled in a helical manner with gradually reducing radius towards an end of the spring remote from said first portion.

4. A battery contact according to claim 1 wherein said first portion includes at least one tab for electrically connecting the battery contact to an electric circuit.

5. A battery contact according to claim 1 wherein said first portion includes at least one retaining prong for locating and fixing the battery contact to an electric circuit.

6. A battery contact according to claim 1 further comprising a handling portion between said first and second portions for enabling automatic pick-up of the battery contact.

7. A battery contact according to claim 6 wherein said handling portion is substantially flat.

* * * * *